(12) United States Patent
Feng et al.

(10) Patent No.: US 11,482,574 B2
(45) Date of Patent: Oct. 25, 2022

(54) TRANSPARENT DISPLAY PANEL AND TRANSPARENT DISPLAY APPARATUS

(71) Applicant: Shenzhen China Star Optoelectronics Semiconductor Display Technology Co., Ltd., Shenzhen (CN)

(72) Inventors: Zhengyu Feng, Shenzhen (CN); Yong Fan, Shenzhen (CN)

(73) Assignee: Shenzhen China Star Optoeleetronics Semiconductor Display Technology Co., Ltd., Shenzhen (CN)

( * ) Notice: Subject to any disclaimer, the term of this patent is extended or adjusted under 35 U.S.C. 154(b) by 238 days.

(21) Appl. No.: 16/766,796

(22) PCT Filed: May 9, 2020

(86) PCT No.: PCT/CN2020/089439
§ 371 (c)(1),
(2) Date: May 26, 2020

(87) PCT Pub. No.: WO2021/217703
PCT Pub. Date: Nov. 4, 2021

(65) Prior Publication Data
US 2022/0123063 A1    Apr. 21, 2022

(30) Foreign Application Priority Data
Apr. 28, 2020  (CN) .......................... 202010348531.5

(51) Int. Cl.
*G09G 3/32* (2016.01)
*H01L 27/32* (2006.01)
*G09G 3/3208* (2016.01)

(52) U.S. Cl.
CPC ........... *H01L 27/3218* (2013.01); *G09G 3/32* (2013.01); *G09G 3/3208* (2013.01); *H01L 27/3276* (2013.01)

(58) Field of Classification Search
CPC ...... G09G 3/32; G09G 3/3208; G09G 3/3258; G09G 3/3291; H01L 27/3218; H01L 27/3276
See application file for complete search history.

(56) References Cited

U.S. PATENT DOCUMENTS

| 9,892,672 B2 * | 2/2018 | Lee ..................... H01L 27/3218 |
| 10,365,778 B2 * | 7/2019 | Kim .................... H01L 27/3272 |
| 10,679,551 B2 * | 6/2020 | Yang ................... G09G 3/3266 |

(Continued)

FOREIGN PATENT DOCUMENTS

| CN | 102749777 | 10/2012 |
| CN | 103424916 | 12/2013 |

(Continued)

*Primary Examiner* — Vijay Shankar

(57) ABSTRACT

The present invention provides a transparent display panel and a transparent display apparatus, which includes a plurality of subpixel rows arranged in parallel along a first direction, the subpixel row including a plurality of subpixels arranged in parallel along a second direction; a gate line, provided at an interval of one subpixel row; and a plurality of signal line groups, passing through the plurality of subpixel rows, one signal line group provided at an interval of at least two subpixels in the plurality of subpixel rows, the signal line group at least including two signal lines.

12 Claims, 6 Drawing Sheets

(56) References Cited

U.S. PATENT DOCUMENTS

| | | | | |
|---|---|---|---|---|
| 11,024,233 B2* | 6/2021 | Park | ................... | G09G 3/3266 |
| 11,069,881 B2* | 7/2021 | Jung | ................... | H01L 27/326 |
| 2013/0162616 A1 | 6/2013 | Park et al. | | |
| 2020/0118494 A1* | 4/2020 | Park | ................... | G09G 3/3266 |

FOREIGN PATENT DOCUMENTS

| | | |
|---|---|---|
| CN | 104298041 | 1/2015 |
| CN | 105549259 | 5/2016 |
| CN | 110189627 | 8/2019 |

* cited by examiner

TRANSPARENT DISPLAY PANEL AND TRANSPARENT DISPLAY APPARATUS

RELATED APPLICATIONS

This application is a National Phase of PCT Patent Application No. PCT/CN2020/089439 having International filing date of May 9, 2020, which claims the benefit of priority of Chinese Patent Application No. 202010348531.5 filed on Apr. 28, 2020. The contents of the above applications are all incorporated by reference as if fully set forth herein in their entirety.

FIELD AND BACKGROUND OF THE INVENTION

The present application relates to display technologies, and more particularly to display panel manufacture technologies, and specifically relates to a transparent display panel and a transparent display apparatus.

SUMMARY OF THE INVENTION

Transparent display technologies have a wide prospect for applications since it can not only present images on a display screen, but also present real objects behind the display screen.

However, transparent areas and non-transparent areas are periodically distributed in existing transparent display panels, and thus form a structure similar to a grating structure. Strong diffraction will occur when environment light passes through the transparent display panel, resulting in an obvious ghosting effect for the images on the transparent display panel and lowering image quality of the transparent display panel.

Above all, there is a need to provide a transparent display panel and a transparent display apparatus for solving the problem of obvious ghosting effect caused during the transparent display panel displays images.

The embodiments of the present application provide a transparent display panel and a transparent display apparatus, which solve the problem of obvious ghosting effect generated during the transparent display panel displays images, caused by strong diffraction occurred when environment light passes through the transparent display panel in the existing art, by arranging one signal line group at an interval of at least two subpixels in a plurality of subpixel rows, where each of the plurality of signal line groups at least includes two signal lines.

An embodiment of the present application provides a transparent display panel, including:

a plurality of subpixel rows arranged in parallel along a first direction, each of the plurality of subpixel rows including a plurality of subpixels, the plurality of subpixels in each subpixel row arranged in parallel along a second direction;

a plurality of gate lines, one gate line provided at an interval of one subpixel row or at least two gate lines provided at an interval of at least two subpixel rows; and a plurality of signal line groups, passing through the plurality of subpixel rows, one signal line group provided at an interval of at least two subpixels in the plurality of subpixel rows, each subpixel row divided into a plurality of areas by the plurality of signal line groups, the plurality of areas being different in area, the signal line group including:

a first data line and a second data line, an area located in each subpixel row and between two adjacent signal line groups including a first subpixel and a second subpixel, the first data line of the signal line group connecting to the first subpixels at one side of the signal line group and the second data line of the signal line group connecting to the second subpixels at the other side of the signal line group.

In an embodiment, the signal line group further includes a third data line and an area located in each subpixel row and between two adjacent signal line groups further includes a third subpixel, wherein the third data line of the signal line group connects to the third subpixels at one side of the signal line group.

In an embodiment, the signal line group further includes a first voltage line and a second voltage line, wherein the first voltage line and the first data line of the signal line group connect to same first subpixels, and the second voltage line and the second data line of the signal line group connect to same second subpixels.

In an embodiment, two gate lines are provided at an interval of two subpixel rows, wherein one of the two gate lines connects to the subpixel row at one side of the two gate lines, and the other one of the two gate lines connects to the subpixel row at the other side of the two gate lines.

In an embodiment, the signal line group includes a first data line and a second data line, an area located in each subpixel row and between two adjacent signal line groups includes a first subpixel and a second subpixel, the first data line and the second data line of the signal line group connect to the first subpixels and the second subpixels at a same side of the signal line group, respectively.

In an embodiment, when one gate line is provided at an interval of one subpixel row, areas, each of which is between two adjacent gate lines, are different in area.

In an embodiment, the transparent display panel further includes:

a plurality of ground lines, one ground line provided at an interval of one subpixel row; or the plurality of ground lines passing through the plurality of subpixel rows, and one ground line provided at an interval of one subpixel in the plurality of subpixel rows.

An embodiment of the present application further provides another type of transparent display panel, including:

a plurality of subpixel rows arranged in parallel along a first direction, each of the plurality of subpixel rows including a plurality of subpixels, the plurality of subpixels in each subpixel row arranged in parallel along a second direction;

a plurality of gate lines, one gate line provided at an interval of one subpixel row or at least two gate lines provided at an interval of at least two subpixel rows; and a plurality of signal line groups, passing through the plurality of subpixel rows, one signal line group provided at an interval of at least two subpixels in the plurality of subpixel rows, each of the plurality of signal line groups at least including two signal lines.

In an embodiment, the signal line group includes a first data line and a second data line, an area located in each subpixel row and between two adjacent signal line groups including a first subpixel and a second subpixel, the first data line of the signal line group connecting to the first subpixels at one side of the signal line group and the second data line of the signal line group connecting to the second subpixels at the other side of the signal line group.

In an embodiment, the signal line group further includes a third data line and an area located in each subpixel row and between two adjacent signal line groups further includes a third subpixel, wherein the third data line of the signal line group connects to the third subpixels at one side of the signal line group.

In an embodiment, the signal line group further includes a first voltage line and a second voltage line, wherein the first voltage line and the first data line of the signal line group connect to same first subpixels, and the second voltage line and the second data line of the signal line group connect to same second subpixels.

In an embodiment, two gate lines are provided at an interval of two subpixel rows, wherein one of the two gate lines connects to the subpixel row at one side of the two gate lines, and the other one of the two gate lines connects to the subpixel row at the other side of the two gate lines.

In an embodiment, the light emitting part is an inorganic light emitting diode, and the signal line group includes a first data line and a second data line, an area located in each subpixel row and between two adjacent signal line groups includes a first subpixel and a second subpixel, the first data line and the second data line of the signal line group connect to the first subpixels and the second subpixels at a same side of the signal line group, respectively.

In an embodiment, each subpixel row is divided into a plurality of areas by the plurality of signal line groups, and the plurality of areas being different in area.

In an embodiment, when one gate line is provided at an interval of one subpixel row, areas, each of which is between two adjacent gate lines, are different in area.

In an embodiment, the transparent display panel further includes:

a plurality of ground lines, one ground line provided at an interval of one subpixel row; or the plurality of ground lines passing through the plurality of subpixel rows, and one ground line provided at an interval of one subpixel in the plurality of subpixel rows.

An embodiment of the present invention further provides a transparent display apparatus, including a transparent display panel including:

a plurality of subpixel rows arranged in parallel along a first direction, each of the plurality of subpixel rows including a plurality of subpixels, the plurality of subpixels in each subpixel row arranged in parallel along a second direction;

a plurality of gate lines, one gate line provided at an interval of one subpixel row or at least two gate lines provided at an interval of at least two subpixel rows; and a plurality of signal line groups, passing through the plurality of subpixel rows, one signal line group provided at an interval of at least two subpixels in the plurality of subpixel rows, each of the plurality of signal line groups at least including two signal lines.

In an embodiment, the signal line group includes a first data line and a second data line, an area located in each subpixel row and between two adjacent signal line groups including a first subpixel and a second subpixel, the first data line of the signal line group connecting to the first subpixels at one side of the signal line group and the second data line of the signal line group connecting to the second subpixels at the other side of the signal line group.

The beneficial effects of the present application are described as follow. The transparent display panel and the transparent display apparatus provided in the embodiments of the present application includes a plurality of subpixel rows arranged in parallel along a first direction, each of the plurality of subpixel rows including a plurality of subpixels 104 arranged in parallel along a second direction. One signal line group is provided at an interval of at least two subpixels in the plurality of subpixel rows, each of the plurality of signal line groups at least including two signal lines. That is, accordingly, the distance between two adjacent signal line groups increases and this increases the period of a grating structure constructed by the subpixels and the signal line groups. This weakens the diffraction phenomenon caused by environment light, thereby weakening the ghosting effect caused when the transparent display panel displays images and improving image quality of the transparent display panel.

BRIEF DESCRIPTION OF THE SEVERAL VIEWS OF THE DRAWINGS

The present invention will be further illustrated below by referring to appending figures. It should be noted that the appending figures described below are only some embodiments used to illustrate the present invention, and those of ordinary skill in the art can further obtain other figures according to these figures without making any inventive effort.

DESCRIPTION OF SPECIFIC EMBODIMENTS OF THE INVENTION

Figure 1:
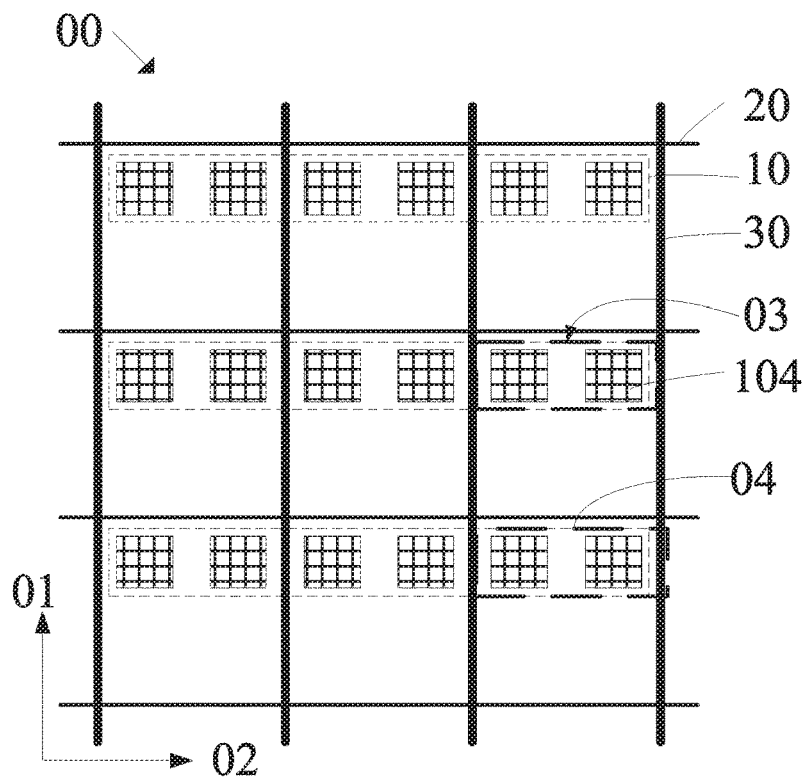
FIG. 1 is a top view of a first type of transparent display panel provided in an embodiment of the present invention.

The technical solutions in the embodiments of the present application will be clearly and completely described below with reference to appended drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application.

In the description of the present invention, it is to be understood that the terms "upper", "lower", "left", "right", "first direction", "second direction" and the like indicated orientation or positional relationship are based on the relationship of the position or orientation shown in the drawings, wherein "upper" indicates a surface located above an object, specifically right above, obliquely upward or on the upper surface of the object as long as it is located above a level of the object, and "close to (or near)" indicates a smaller distance to a side of a second object with respect to several sides of a first object. The aforesaid relationship of the position or orientation is only for the purpose of facilitating description of the present invention and simplifying the description, but is not intended to or implied that the device or element referred to must have a specific orientation, and be constructed and operated in a particular orientation. Therefore, it should not be construed as a limitation of the present invention.

In addition, it further needs to be explained that the appending drawings provide only the structures or steps that are closely related to the present invention, and omit some details that are less related to the invention. The purpose of this is to simplify the appending drawings and make the invention clear at a glance, instead of making the appending drawings exactly same as the actual device or method. The appending drawings should not be construed as a limitation of the actual device and method.

The present invention provides a transparent display panel, which includes, but is not limited to, the following embodiments.

Figure 2:
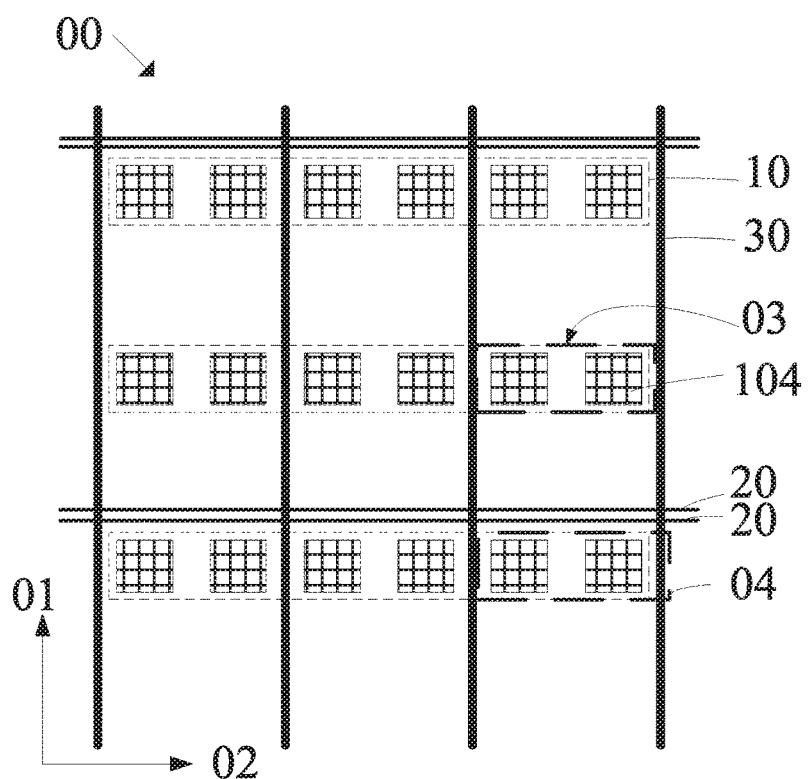
FIG. 2 is a top view of a second type of transparent display panel provided in an embodiment of the present invention.

In an embodiment, as shown in FIG. 1 and FIG. 2, the transparent display panel 00 includes a plurality of subpixel rows 10 arranged in parallel along a first direction 01, each of the plurality of subpixel rows 10 including a plurality of subpixels 104, the plurality of subpixels 104 in each subpixel row 10 arranged in parallel along a second direction; a plurality of gate lines 20, one gate line 20 provided at an interval of one subpixel row 10 as shown in FIG. 1 or at least two gate lines 20 provided at an interval of at least two subpixel rows 10; a plurality of signal line groups 30, passing through the plurality of subpixel rows 10, one signal line group 30 provided at an interval of at least two subpixels 104 in the plurality of subpixel rows 10, each of the plurality of signal line groups 30 at least including two signal lines. One signal line group 30 provided at an interval of two subpixels 104 in the plurality of subpixel rows 10 is taken herein as an example for illustration as depicted in FIG. 1 and FIG. 2.

The essence of the subpixels 104 may be an organic light-emitting diode (OLED) device or a micro light-emitting diode (micro LED) device. Further, since the transparent display panel 00 is used to display images transparently, a transparent area should be large enough for the transparent display panel 00. The transparent display panel 00 can be a micro LED transparent display panel. At least one of the size of the subpixels 104 along the first direction 01 and the size of the subpixels 104 along the second direction 02 may be not less than 1 micrometer and not greater than 10 micrometers. For ease of description herein, the signal line groups 30, the gate lines 20 and the subpixels 104 may be defined as a light shielding area, other area in the transparent display panel 00 except the light shielding area may be defined as a transparent area, and an area located in each subpixel row 10 and between two adjacent signal line groups 30 may be defined as a first area 03. Since a plurality of first areas 03 arranged along the second direction 02 and a plurality of signal line groups 30 can construct a structure similar to a grating structure, each first area 03 and a signal line group 30 located at one side of the first area 03 may be defined as a first unit 04 herein, that is, the size of the first unit 04 along the second direction 02 is treated as a first period.

It can be understood that the present embodiment ensures that there is no line or circuit between at least two columns of subpixels 104 along the second direction 02 by arranging one signal line group 30 at an interval of at least two subpixels 104 in the plurality of subpixel rows 10, where each of the plurality of signal line groups 30 includes at least two signal lines, that is, at least two lines for controlling at least two columns of subpixels 104 are integrated into one signal line group 30 at one side of one of the two columns of subpixels 104.

On one hand, from a grating formula d*sin θ=n*λ, where d is the spacing between two slits (i.e., the first period in the present embodiment), θ is a diffraction angle, n is a grating order, and λ is wavelength, it can be known that for any grating order n, the greater the spacing d between the two slits and the smaller the diffraction angle θ, the weaker the diffraction phenomenon. In extreme cases, it can be understood that there is no grating structure at all and thus there is no diffraction phenomenon when the spacing d between the two slits is extremely large. Accordingly, compared to the existing art, the present embodiment essentially makes the size of the first unit 04 along the second direction 02 larger, that is, makes the first period larger, and can reduce the diffraction angle, thereby weakening the diffraction phenomenon to weaken the ghosting effect.

On the other hand, based on the theory, it can also be known that when the wavelength λ is fixed, reducing the width of the slits will increase the width of a central bright line in single-slit diffraction, thereby making the diffraction more obvious. When the total length of a grating is a constant, increasing the number of the slits will reduce relative light intensity of the secondary maximum. When there are many slits, the secondary maximum is very small and stripes of the primary maximum are thin and bright. This makes the diffraction phenomenon more obvious. Accordingly, compared to the existing art, the present embodiment substantially increases the size of the first unit 04 along the second direction 02 while the total length of the transparent display panel 00 along the second direction 02 is a constant. That is, the width of the slits increases and the number of slits is reduced, thereby weakening the diffraction phenomenon to weaken the ghosting effect.

Figure 3:
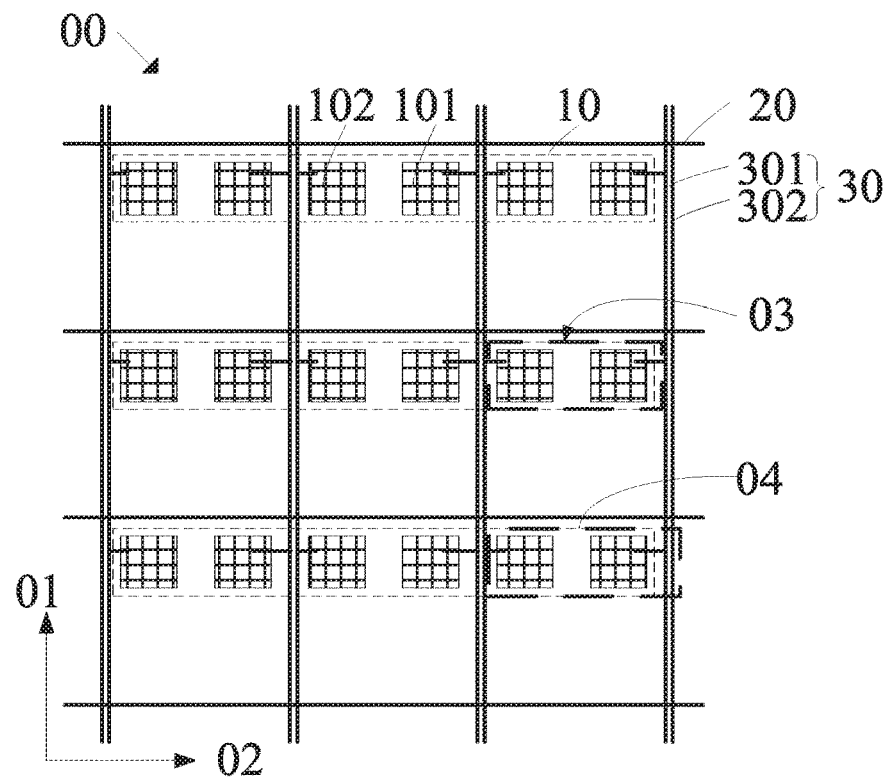
FIG. 3 is a top view of a third type of transparent display panel provided in an embodiment of the present invention.

In an embodiment, as shown in FIG. 3, taking one gate line 20 provided at an interval of one subpixel row 10 for example, the signal line group 30 includes a first data line 301 and a second data line 302. An area (i.e., the first area 03) located in each subpixel row 10 and between two adjacent signal line groups 30 includes a first subpixel 101 and a second subpixel 102. The first data line 301 of the signal line group 30 connects to a plurality of first subpixels 101 at one side of the signal line group 30 and a second data line 302 of the signal line group 30 connects to a plurality of second subpixels 102 at the other side of the signal line group 30.

Specifically, when the second subpixel 102 and the first subpixel 101 of the first area 03 are sequentially arranged along the second direction 02, the first data line 301 and the second data line 302 of the signal line group 30 may be sequentially arranged along the second direction 02 such that the first data line 301 is close to a corresponding first subpixel 101 and the second data line 302 is close to a corresponding second subpixel 102 for ease of connecting the first data line 301 to the corresponding first subpixel 101 and connecting the second data line 302 to the corresponding second subpixel 102.

It can be understood that different from arranging the first data line 301 and the second data line 302, which are used to connect the first subpixel 101 and the second subpixel 102 of the first area 03, at the left side of the first subpixel 101 and the left side of the second subpixel 102 respectively in the existing art, the present embodiment ensures that there is no line or circuit between the first subpixel 101 and the second subpixel 102 of the first area 03 by arranging the first data line 301 and the second data line 302, which are used to connect the first subpixel 101 and the second subpixel 102 of the first area 03, at the left and right sides of the first area 03, respectively, according to connection relations between them. On the basis of the relevant theory described above, the present embodiment increases the first period and the width of the slits, reduces the number of the slits and can reduce the diffraction angle, thereby weakening the diffraction phenomenon to weaken the ghosting effect.

Figure 4:
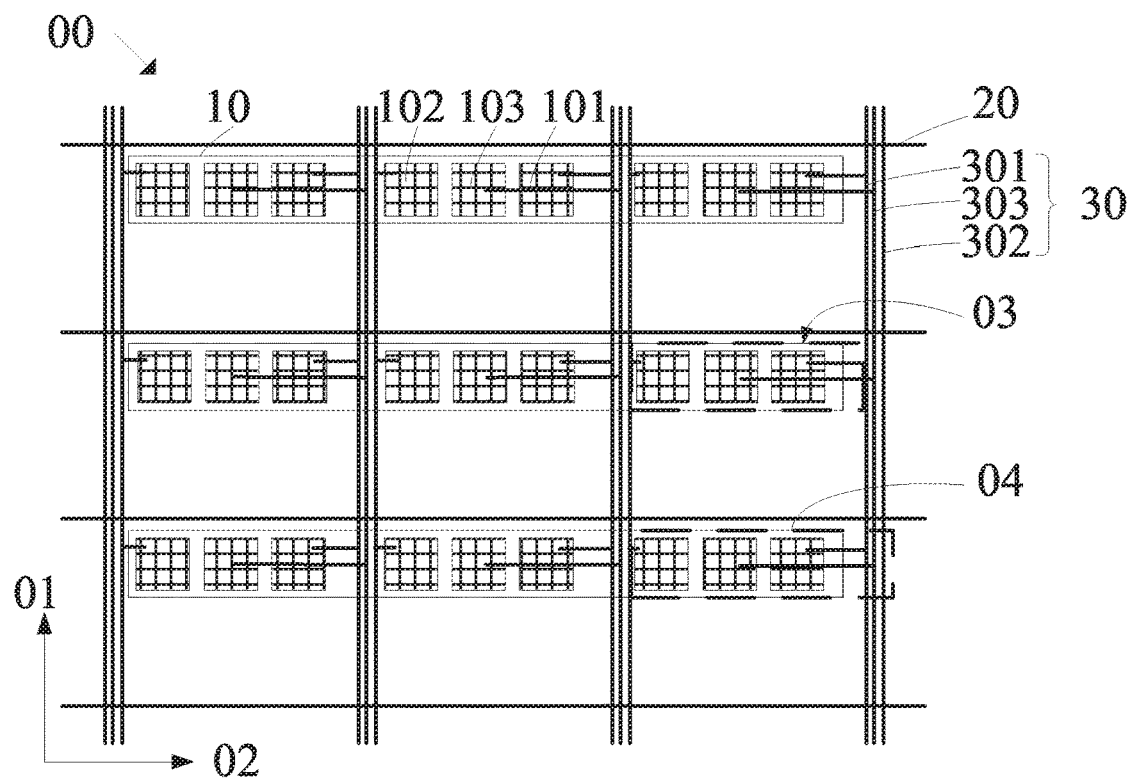
FIG. 4 is a top view of a fourth type of transparent display panel provided in an embodiment of the present invention.

In an embodiment, as shown in FIG. 4, on the basis of the embodiment shown in FIG. 3, the signal line group 30 further includes a third data line 303 and an area (i.e., the first area 03) located in each subpixel row 10 and between two adjacent signal line groups 30 further includes a third subpixel 103. The third data line 303 of the signal line group 30 connects to a plurality of third subpixels 103 at one side of the signal line group 30.

Specifically, when the third subpixel 103 of the first area 03 is located between the second subpixel 102 and the first subpixel 101, the third data line 303 of the signal line group 30 may be located between the first data line 301 and the second data line 302 such that the third data line 303 correspondingly connected to the third subpixel 103 may be located at the left or right side of a corresponding first area 03 on the promise that it is easy to connect the first data line 301 to the corresponding first subpixel 101 and connect the second data line 302 to the corresponding second subpixel 102.

Similarly, the present embodiment ensures that there is no line or circuit between any two of the first subpixel 101, the second subpixel 102 and the third subpixel 103 of the first area 03 by arranging the first data line 301, the second data line 302 and the third data line 303, which are used to connect the first subpixel 101, the second subpixel 102 and the third subpixel 103 of the first area 03, at the left and right sides of the first area 03, respectively. Compared to the embodiment shown in FIG. 3, the present embodiment further increases the first period and the width of the slits, reduces the number of the slits and can reduce the diffraction angle, thereby weakening the diffraction phenomenon to weaken the ghosting effect.

Figure 5:
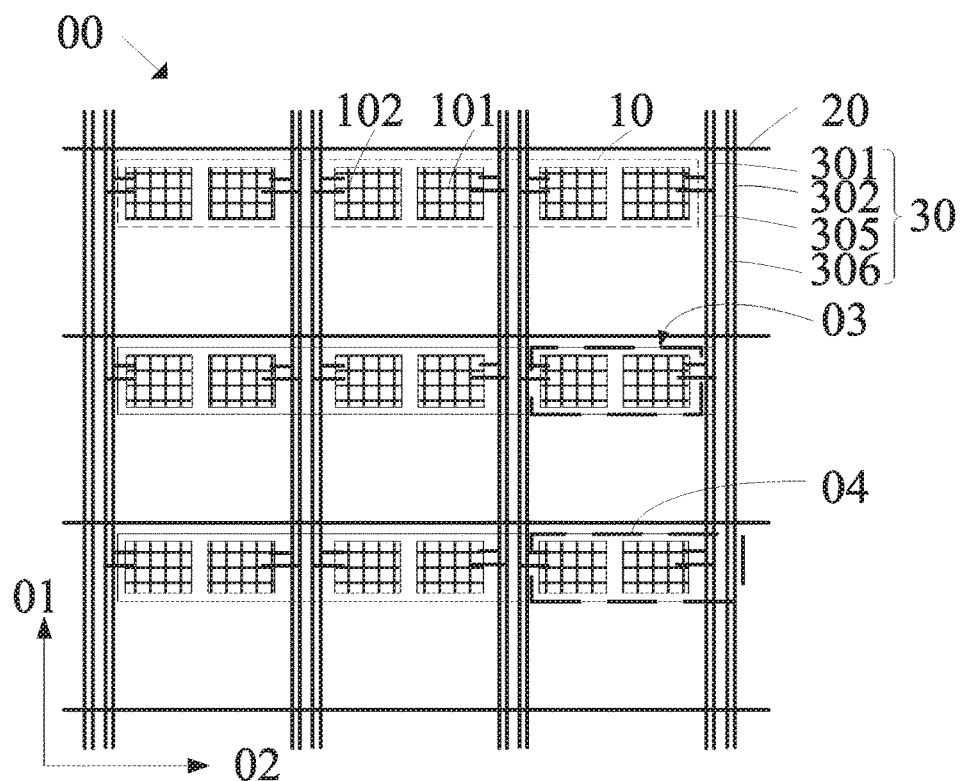
FIG. 5 is a top view of a fifth type of transparent display panel provided in an embodiment of the present invention.

In an embodiment, as shown in FIG. 5, on the basis of the embodiment shown in FIG. 3, the signal line group 30 further includes a first voltage line 305 and a second voltage line 306. The first voltage line 305 and the first data line 301 of the signal line group 30 connect to same first subpixels 101. The second voltage line 306 and the second data line 302 of the signal line group 30 connect to same second subpixels 102.

Specifically, the first voltage line 305 and the first data line 301 of the signal line group 30 may be close to a corresponding first subpixel 101, and the second voltage line 306 and the second data line 302 of the signal line group 30 may be close to a corresponding second subpixel 102 for ease of connecting the first data line 301 and a corresponding first voltage line 305 to the corresponding first subpixel 101 and connecting the second data line 302 and a corresponding second voltage line 306 to the corresponding second subpixel 102. In a same signal line group 30, relative position of the first voltage line 305 and the first data line 301 and relative position of the second voltage line 306 and the second data line 302 are not limited.

Similarly, the present embodiment ensures that there is no line or circuit between the first subpixel 101 and the second subpixel 102 of the first area 03 by arranging the first data line 301 and the first voltage line 305, which are used to connect the first subpixel 101 of the first area 03, at one side of the first area 03 and arranging the second data line 302 and the second voltage line 306, which are used to connect the second subpixel 102 of the first area 03, at the other side of the first area 03. Compared to the embodiment shown in FIG. 3, the present embodiment just increases types of lines or circuits of the signal line group 30. The embodiment shown in FIG. 3 or the present embodiment can be selected based on practical situations of the type of lines or circuits. That is, the present embodiment increases the first period and the width of the slits as well, reduces the number of the slits and can reduce the diffraction angle, thereby weakening the diffraction phenomenon to weaken the ghosting effect.

Figure 6:
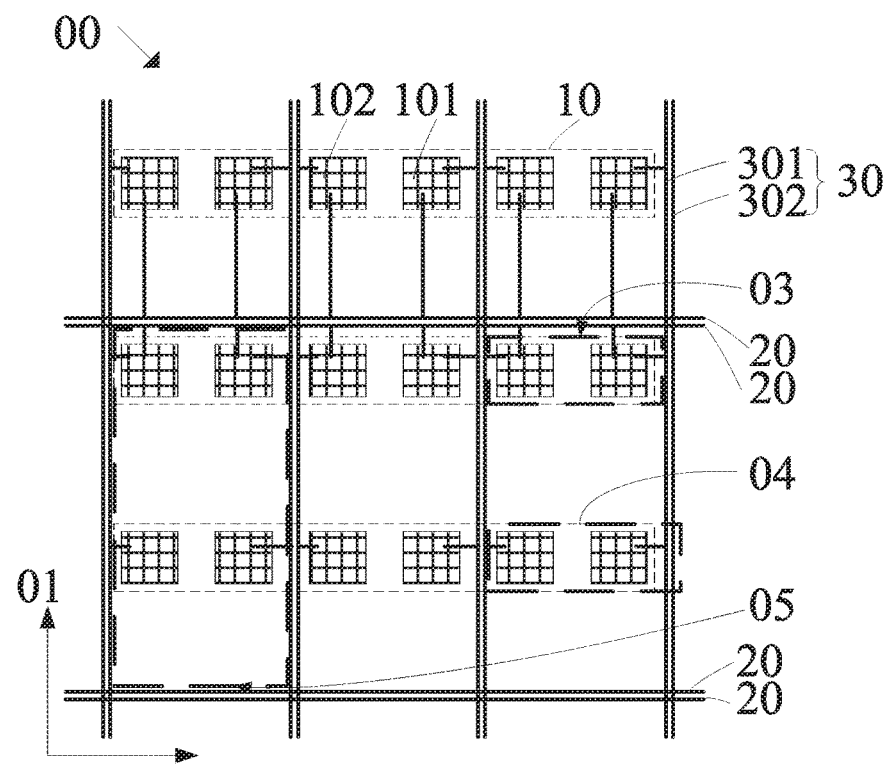
FIG. 6 is a top view of a sixth type of transparent display panel provided in an embodiment of the present invention.

In an embodiment, as shown in FIG. 6, on the basis of the embodiment shown in FIG. 3, two gate lines 20 are provided at an interval of two subpixel rows 10, where one of the two gate lines 20 connects to the subpixel row 10 at one side of the two gate lines 20 and the other one of the two gate lines 20 connects to the subpixel row 10 at the other side of the two gate lines 20.

Similarly, since two gate lines 20 are provided at an interval of two subpixel rows 10 and the two gate lines 20 connect to the two subpixel rows 10 located at an upper side and a lower side of the two gate lines 20 respectively, the present embodiment ensures that there is no gate line 20 between the two subpixel rows 10 by arranging the two gate lines 20, which are used to connect the two adjacent subpixel rows 10 respectively, at the upper side and the lower side of a whole formed by the two adjacent subpixel rows 10, respectively. Compared to the embodiment shown in FIG. 3, the present embodiment further removes gate lines 20 between some adjacent subpixel rows 10. For ease of description, two gate lines 20 of the two adjacent subpixel rows 10 may be defined as one gate line group, a second area 05 is defined as limited by two adjacent gate line groups and two adjacent signal line groups 30, and the second area 05 and the two gate lines 20 located at the upper side or the lower side of the second area 05 are defined as one second unit. The size of the second unit along the first direction 01 is treated as a second period. That is, the present embodiment further increases the second period and the width of the slits, reduce the number of the slits and can reduce the diffraction angle, thereby weakening the diffraction phenomenon to weaken the ghosting effect.

Figure 7:
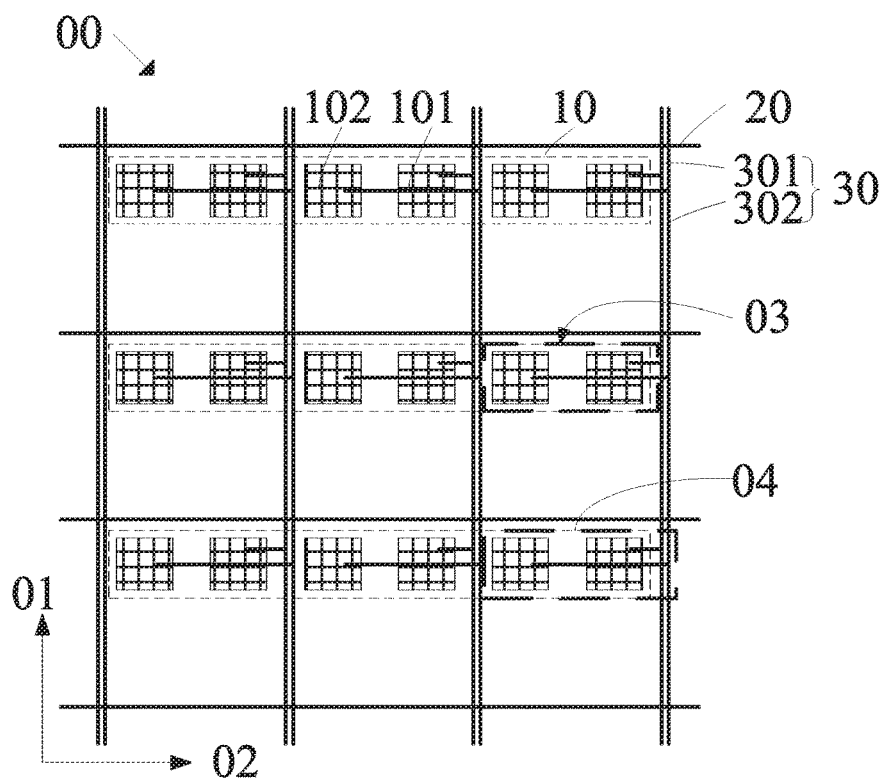
FIG. 7 is a top view of a seventh type of transparent display panel provided in an embodiment of the present invention.

In an embodiment, as shown in FIG. 7, the signal line group 30 includes a first data line 301 and a second data line 302. An area (i.e., the first area 03) located in each subpixel row 10 and between two adjacent signal line groups 30 includes a first subpixel 101 and a second subpixel 102. The first data line 301 and the second data line 302 of the signal line group 30 connects to a plurality of first subpixels 101 and a plurality of second subpixels 102 located at a same side of the signal line group 30, respectively.

It can be understood that the difference between the present embodiment and the embodiment shown in FIG. 3 is that both of the first data line 301 and the second data line 302 of the signal line group 30 in the present embodiment connect to the subpixels located at the left side or the right side of the signal line group 30. That is, the present embodiment ensures that there is no line or circuit between the first subpixel 101 and the second subpixel 102 of the first area 03 by arranging both of the first data line 301 and the second data line 302, which are used to connect the first subpixel 101 and the second subpixel 102 of the first area 03, at the left side or the right side of the first area 03. That is, the present embodiment increases the first period and the width of the slits as well, reduces the number of the slits and can reduce the diffraction angle, thereby weakening the diffraction phenomenon to weaken the ghosting effect.

Figure 8:
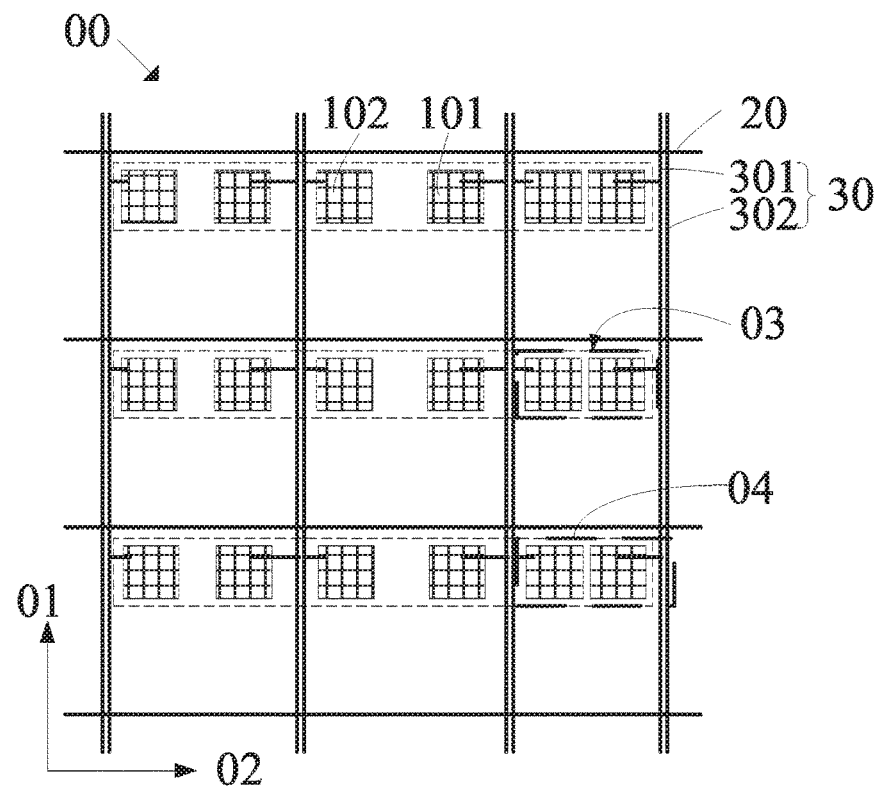
FIG. 8 is a top view of an eighth type of transparent display panel provided in an embodiment of the present invention.

In an embodiment, as shown in FIG. 8, this embodiment will be illustrated on the basis of the embodiment shown in FIG. 3. Each subpixel row 10 is divided into a plurality of areas (i.e., the first areas 03) by the plurality of signal line groups 30. The plurality of areas (i.e., the first areas 03) are different in area.

Specifically, the size of the plurality of the first areas 03 along the second direction 02 is not equal to each other. For example, in FIG. 7, the area of the first area 03 in the second column>the area of the first area 03 in the first column>the area of the first area 03 in the third column. It can be understood that for example, when the size of the plurality of the first areas 03 along the second direction 02 is not equal to each other, at least two first areas 03 arranged along the second direction 02 and at least two signal line groups 30 are needed to construct one repeating unit. That is, compared to above embodiments, the present embodiment can destroy the periodicity of the arranged first areas 03 and signal line groups 30 or increase the period of a grating structure constructed by the first areas 03 and the signal line groups 30. That is, the present embodiment further destroys the periodicity of the arranged first areas 03 and signal line groups 30 or further increase the period of the grating structure constructed by the first areas 03 and the signal line groups 30 so as to reduce the diffraction angle, thereby weakening the diffraction phenomenon to weaken the ghosting effect.

Figure 9:
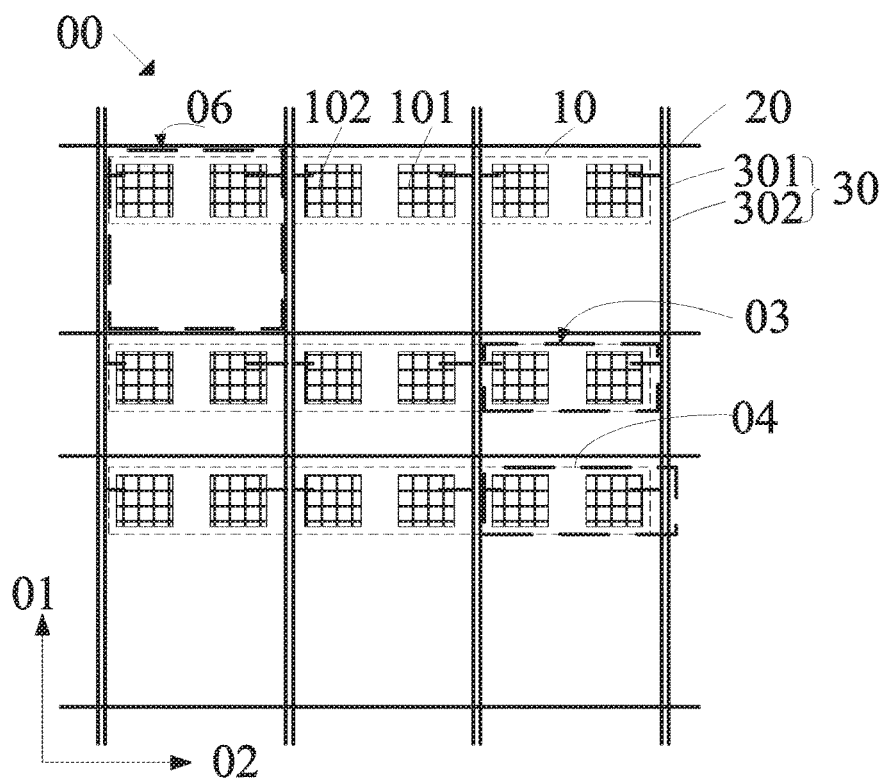
FIG. 9 is a top view of a ninth type of transparent display panel provided in an embodiment of the present invention.

In an embodiment, as shown in FIG. 9, this embodiment will be illustrated on the basis of the embodiment shown in FIG. 3. When one gate line 20 is provided at an interval of one subpixel row 10, the areas, each of which is between two adjacent gate lines 20, are different in area.

Specifically, if one third area 06 is defined as limited by two adjacent gate lines 20 and two adjacent signal line groups 30, a plurality of third areas 06 may not be equal to each other in area. Further, the size of the plurality of the third areas 06 along the first direction 01 is not equal to each other. For example, in FIG. 8, the area of the third area 06 in the third row>the area of the third area 06 in the first row>the area of third area 06 in the second row. Similarly, the present embodiment further destroys the periodicity of the arranged third areas 06 and gate lines 20 or further increase the period of a grating structure constructed by third areas 06 and the gate lines 20 so as to reduce the diffraction angle, thereby weakening the diffraction phenomenon to weaken the ghosting effect.

It can be understood that for the embodiment shown in FIG. 6, when two gate lines 20 are provided at an interval of two subpixel rows 10, the areas, each of which is between two adjacent gate line groups, are different in area.

Specifically, a plurality of second areas 05 are different in area. Similarly, the present embodiment further destroys the periodicity of the arranged second areas 05 and gate line groups or further increase the period of a grating structure constructed by second areas 05 and the gate line groups so as to reduce the diffraction angle, thereby weakening the diffraction phenomenon to weaken the ghosting effect.

Figure 10:
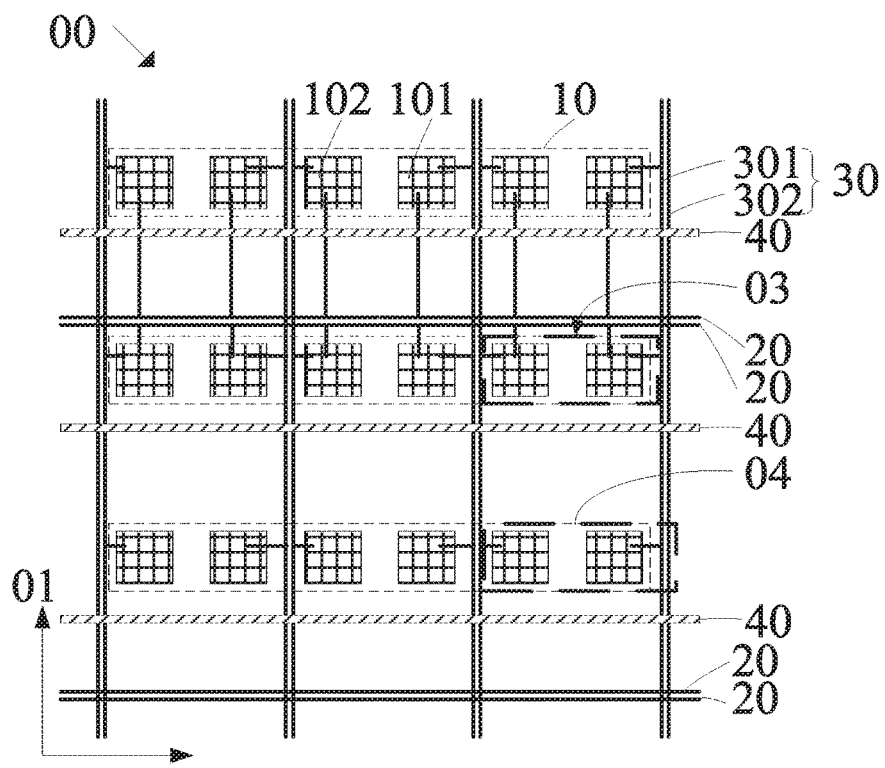
FIG. 10 is a top view of a tenth type of transparent display panel provided in an embodiment of the present invention.
Figure 11:
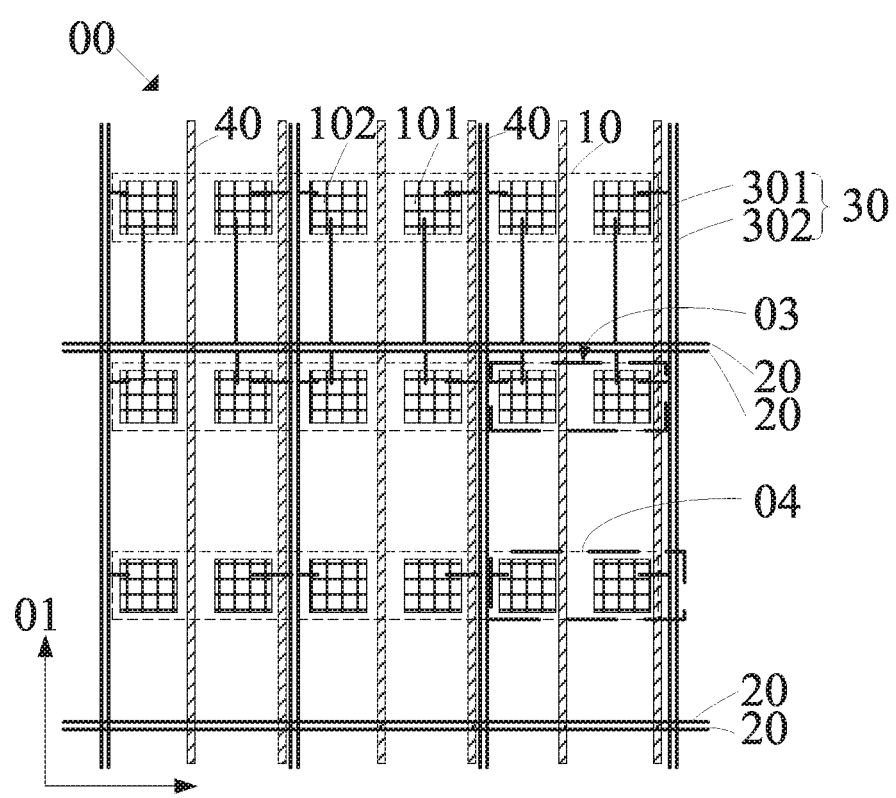
FIG. 11 is a top view of an eleventh type of transparent display panel provided in an embodiment of the present invention.

In an embodiment, as shown in FIG. 10 and FIG. 11, these embodiments will be illustrated on the basis of the embodiment shown in FIG. 6. The transparent display panel 00 further includes a plurality of ground lines 40. As shown in FIG. 10, one ground line 40 is provided at an interval of one subpixel row 10. Alternatively, as shown in FIG. 11, the plurality of ground lines 40 pass through the plurality of subpixel rows 10 and one ground line 40 is provided at an interval of one subpixel in the plurality of subpixel rows 10.

Specifically, as shown in FIG. 10, it can be understood that one ground line 40 is provided at the lower side of each subpixel row 10. Each subpixel row 10 and a corresponding ground line 40 are taken as a whole. That is, an area between two adjacent gate line groups and any of the two adjacent gate line groups may serve as a repeating unit. Similarly, the way used to deploy the gate line groups can increase the period of the grating structure along the first direction 01. As shown in FIG. 11, it can be understood that one ground line 40 is provided at the right side of each subpixel row 10. Each subpixel row 10 and a corresponding ground line 40 are taken as a whole. That is, the first area 03 and the signal line group 30 located at the left side or the right side of the first area 03 may serve as a repeating unit. Similarly, the way used to deploy the signal line groups 30 can increase the period of the grating structure along the second direction 02. Accordingly, all the embodiments shown in FIGS. 10-11 can increase the period of a corresponding grating structure so as to reduce the diffraction angle, thereby weakening the diffraction phenomenon to weaken the ghosting effect.

The present invention further provides a transparent display apparatus, which includes the transparent display panel according to any aspect described above.

The transparent display panel and the transparent display apparatus provided in the embodiments of the present application includes a plurality of subpixel rows arranged in parallel along a first direction, each of the plurality of subpixel rows including a plurality of subpixels 104 arranged in parallel along a second direction. One signal line group is provided at an interval of at least two subpixels in the plurality of subpixel rows, each of the plurality of signal line groups at least including two signal lines. That is, accordingly, the distance between two adjacent signal line groups increases and this increases the period of a grating structure constructed by the subpixels and the signal line groups. This weakens the diffraction phenomenon caused by environment light, thereby weakening the ghosting effect caused when the transparent display panel displays images and improving image quality of the transparent display panel.

Hereinbefore, the transparent display panel and the transparent display apparatus provided in the embodiments of the present application are introduced in detail, the principles and implementations of the present application are set forth herein with reference to specific examples, descriptions of the above embodiments are merely served to assist in understanding the technical solutions and essential ideas of the present application. Those having ordinary skill in the art should understand that they still can modify technical solutions recited in the aforesaid embodiments or equivalently replace partial technical features therein; these modifications or substitutions do not make essence of corresponding technical solutions depart from the spirit and scope of technical solutions of embodiments of the present application.

The invention claimed is:
1. A transparent display panel, comprising:
a plurality of subpixel rows arranged in parallel along a first direction, each of the plurality of subpixel rows comprising a plurality of subpixels, the plurality of subpixels in each subpixel row arranged in parallel along a second direction;

a plurality of gate lines, one gate line provided at an interval of one subpixel row or at least two gate lines provided at an interval of at least two subpixel rows; and a plurality of signal line groups, passing through the plurality of subpixel rows, one signal line group provided at an interval of at least three subpixels in each of the plurality of subpixel rows, each subpixel row divided into a plurality of areas by the plurality of signal line groups, the plurality of areas being different in area, the signal line group comprising:

a first data line and a second data line, an area located in each subpixel row and between two adjacent signal line groups comprising a first subpixel and a second subpixel, the first data line of the signal line group connecting to the first subpixels at one side of the signal line group and the second data line of the signal line group connecting to the second subpixels at the other side of the signal line group, wherein the signal line group further comprises a third data line and an area located in each subpixel row and between two adjacent signal line groups further comprises a third subpixel, wherein the third data line of the signal line group connects to the third subpixels at one side of the signal line group.

2. The transparent display panel according to claim 1, wherein the signal line group further comprises a first voltage line and a second voltage line, wherein the first voltage line and the first data line of the signal line group connect to same first subpixels, and the second voltage line and the second data line of the signal line group connect to same second subpixels.

3. The transparent display panel according to claim 1, wherein two gate lines are provided at an interval of two subpixel rows, wherein one of the two gate lines connects to the subpixel row at one side of the two gate lines, and the other one of the two gate lines connects to the subpixel row at the other side of the two gate lines.

4. The transparent display panel according to claim 1, wherein when one gate line is provided at an interval of one subpixel row, areas, each of which is between two adjacent gate lines, are different in area.

5. The transparent display panel according to claim 1, further comprising:

a plurality of ground lines, one ground line provided at an interval of one subpixel row; or the plurality of ground lines passing through the plurality of subpixel rows, and one ground line provided at an interval of one subpixel in the plurality of subpixel rows.

6. A transparent display panel, comprising:

a plurality of subpixel rows arranged in parallel along a first direction, each of the plurality of subpixel rows comprising a plurality of subpixels, the plurality of subpixels in each subpixel row arranged in parallel along a second direction;

a plurality of gate lines, one gate line provided at an interval of one subpixel row or at least two gate lines provided at an interval of at least two subpixel rows; and a plurality of signal line groups, passing through the plurality of subpixel rows, one signal line group provided at an interval of at least three subpixels in each of the plurality of subpixel rows, each of the plurality of signal line groups at least comprising three signal lines, the signal line group comprising:

a first data line and a second data line, an area located in each subpixel row and between two adjacent signal line groups comprising a first subpixel and a second subpixel, the first data line of the signal line group connecting to the first subpixels at one side of the signal line group and the second data line of the signal line group connecting to the second subpixels at the other side of the signal line group, wherein the signal line group further comprises a third data line and an area located in each subpixel row and between two adjacent signal line groups further comprises a third subpixel, wherein the third data line of the signal line group connects to the third subpixels at one side of the signal line group.

7. The transparent display panel according to claim 6, wherein the signal line group further comprises a first voltage line and a second voltage line, wherein the first voltage line and the first data line of the signal line group connect to same first subpixels, and the second voltage line and the second data line of the signal line group connect to same second subpixels.

8. The transparent display panel according to claim 6, wherein two gate lines are provided at an interval of two subpixel rows, wherein one of the two gate lines connects to the subpixel row at one side of the two gate lines, and the other one of the two gate lines connects to the subpixel row at the other side of the two gate lines.

9. The transparent display panel according to claim 6, wherein the first data line and the second data line of the signal line group connect to the first subpixels and the second subpixels at a same side of the signal line group, respectively.

10. The transparent display panel according to claim 6, wherein when one gate line is provided at an interval of one subpixel row, areas, each of which is between two adjacent gate lines, are different in area.

11. The transparent display panel according to claim 6, further comprising:

a plurality of ground lines, one ground line provided at an interval of one subpixel row; or the plurality of ground lines passing through the plurality of subpixel rows, and one ground line provided at an interval of one subpixel in the plurality of subpixel rows.

12. A transparent display apparatus, comprising a transparent display panel comprising:

a plurality of subpixel rows arranged in parallel along a first direction, each of the plurality of subpixel rows comprising a plurality of subpixels, the plurality of subpixels in each subpixel row arranged in parallel along a second direction;

a plurality of gate lines, one gate line provided at an interval of one subpixel row or at least two gate lines provided at an interval of at least two subpixel rows; and a plurality of signal line groups, passing through the plurality of subpixel rows, one signal line group provided at an interval of at least three subpixels in each of the plurality of subpixel rows, each of the plurality of signal line groups at least comprising three signal lines, the signal line group comprising:

a first data line and a second data line, an area located in each subpixel row and between two adjacent signal line groups comprising a first subpixel and a second subpixel, the first data line of the signal line group connecting to the first subpixels at one side of the signal line group and the second data line of the signal line group connecting to the second subpixels at the other side of the signal line group, wherein the signal line group further comprises a third data line and an area located in each subpixel row and between two adjacent signal line groups further comprises a third subpixel, wherein the third data line of the signal line group connects to the third subpixels at one side of the signal line group.

\* \* \* \* \*

UNITED STATES PATENT AND TRADEMARK OFFICE
CERTIFICATE OF CORRECTION

PATENT NO. : 11,482,574 B2
APPLICATION NO. : 16/766796
DATED : October 25, 2022
INVENTOR(S) : Zhengyu Feng et al.

It is certified that error appears in the above-identified patent and that said Letters Patent is hereby corrected as shown below:

On the Title Page

In item (73) Assignee:
"Shenzhen China Star Optoeleetronics Semiconductor Display Technology Co., Ltd."
Should be changed to:
--Shenzhen China Star Optoelectronics Semiconductor Display Technology Co., Ltd.--

Signed and Sealed this
Sixteenth Day of May, 2023

Katherine Kelly Vidal
*Director of the United States Patent and Trademark Office*